AMPLIFIER USING PARAGONED ACTIVE ELEMENTS
Filed Aug. 24, 1964
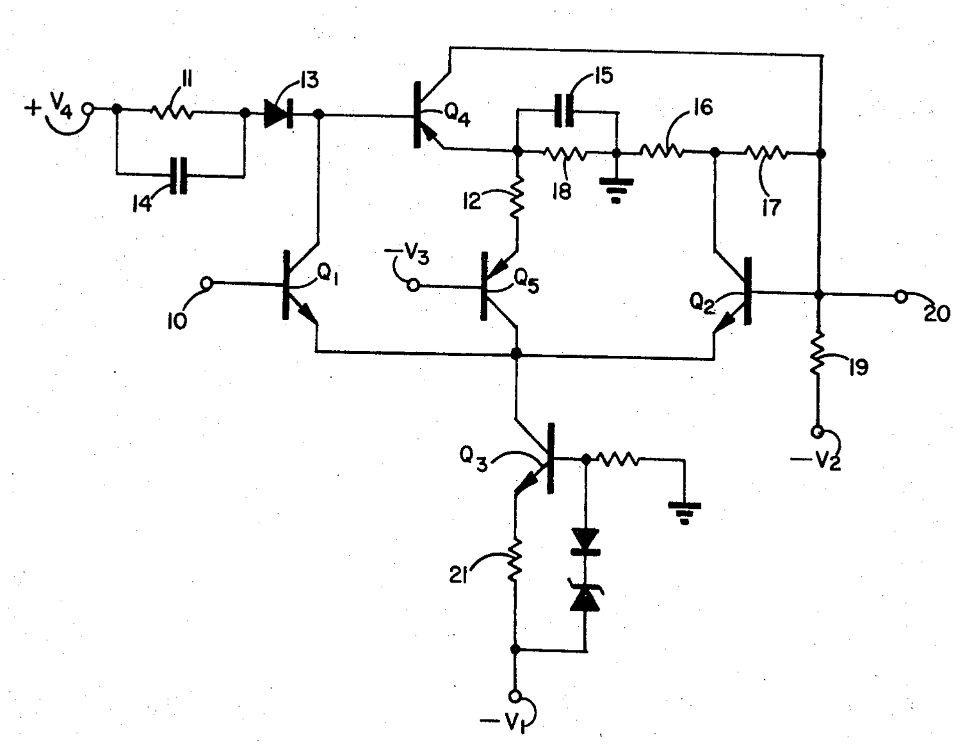
INVENTOR.
RAYMOND T. MATSUMOTO
BY [signature]
ATTORNEY United States Patent Office 3,353,091

Patented Nov. 14, 1967

3,353,091
AMPLIFIER USING PARAGONED ACTIVE ELEMENTS

Raymond T. Matsumoto, Cypress, Calif., assignor to North American Aviation, Inc.

Filed Aug. 24, 1964, Ser. No. 391,368
10 Claims. (Cl. 323—4)

This invention relates to an improved amplifier and more particularly to improvements in amplifier circuits employing paragoned active elements such as transistors for use, although not exclusively, as a buffer between a load and a voltage source.

Differential amplifiers with feedback are typical of the circuits often used as a buffer amplifier which employ paragoned transistors having their emitters connected to a constant current source. The use of a constant current source implies that a difference in current must exist in the paragoned transistors in order to change the output voltage in response to a change in the input voltage. That difference in current introduces an error when the output voltage is fed back to the differential amplifier for comparison with the input voltage due to the difference in base to emitter voltage drops. This is so even though the transistors are closely matched for base-emitter voltage characteristic for a given emitter current because a slight change in current changes that characteristic of each transistor differently, thereby introducing a voltage error in the output voltage.

One method of reducing the voltage error due to a change in the base-emitter voltage characteristic of a differential amplifier with feedback is to provide high gain in the feedback path so that a small change in the differential amplifier is represented as a large change in the output signal being fed back. However, that increases circuit manufacturing costs and power dissipation.

A principle object of this invention is to provide an improved means for mantaining the currents in paragoned active elements equal to each other, particularly but not exclusive under varying load conditions.

A related object is to provide an improved means for maintaining the output voltage of a differential amplifier equal to its input voltage.

These and other objects of this invention are achieved by providing a means for detecting a change of current through one of two paragoned active elements, such as transistor devices having their emitter or source electrodes connected to a source of constant current, and in response thereto causing a change of current of approximately twice the detected change, and of the opposite polarity, in a third circuit connected to the junction of the constant current source and those electrodes. Two active elements are said to be paragoned for the purposes of describing this invention if they are connected in parallel in the sense that both are supplied current from a constant source in such a manner that current in one may be compared with current in the other, as in a differential amplifier and if they are to be matched with respect to their base-emitter or gate-source voltage characteristics.

Other objects and advantages will become apparent from the following description with reference to the drawing in which the sole figure illustrates an embodiment of the invention.

Referring to the drawing, a pair of paragoned NPN transistors $Q_1$ and $Q_2$ are connected to a constant current source comprising a suitably biased transistor $Q_3$. An input terminal 10 connected to the base of the transistor $Q_1$ is adapted to receive a voltage signal from a source not shown. A fourth transistor $Q_4$ has its base connected to the collector of the input transistor $Q_1$ and its collector connected to the base of the transistor $Q_2$ and an output terminal 20. The collector of the transistor $Q_5$ is connected to the constant current source at the junction of the emitters of the transistors $Q_1$ and $Q_2$. However, it could just as well be connected to the emitter of the transistor $Q_3$ for the purposes of this invention.

To better understand the invention, the operation of the circuit without the connection of the transistor $Q_5$ to the current source will first be considered. Assuming a signal $E_1$ at the input terminal 10, the signal $E_2$ at the output terminal 20 will be equal to the signal at the input terminal when the current conducted by the paragoned transistors $Q_1$ and $Q_2$ are equal and at the level for which they were matched. Assuming a voltage $V_{be}$ across the base-emitter junctions of the transistors $Q_1$ and $Q_2$ are equal, at least at that level at which the transistors were matched, the output signal $E_2$ is given by the following equations:

$$E_2=E_1-V_{be1}-I_1r_{e1}+I_2r_{e2}+V_{be2} \quad (1)$$

$$E_2=E_1-I_1r_{e1}+I_2r_{e2} \quad (2)$$

where $r_{e1}$ and $r_{e2}$ represent the internal impedances of transistors $Q_1$ and $Q_2$ respectively. If the currents $I_1$ and $I_2$ remain equal to the output voltage $E_2$ will remain equal to the input voltage $E_1$, assuming $r_{e1}$ is equal to $r_{e2}$.

When the input $E_1$ changes, there must be a difference in the currents $I_1$ and $I_2$ due to the use of a constant current source thereby producing a difference in the voltages in accordance with the following equation:

$$E_2=E_1-(I_1+\Delta I_1)r_{e1}+(I_2-\Delta I_2)r_{e2} \quad (3)$$

This difference equal to $\Delta I_1r_{e1}+\Delta I_2r_{e2}$ is fed back for comparison with the input signal via the transistor $Q_4$ and the base of the transistor $Q_2$, thereby introducing an error due to a difference in emitter currents $I_1$ and $I_2$ which causes a difference in the base-emitter voltages $V_{be1}$ and $V_{be2}$. Thus the paragoned transistors $Q_1$ and $Q_2$ become mismatched and an error equal to $\Delta I_2r_{e2}+\Delta I_2r_{e2}$ is introduced in the output signal $E_2$.

As noted hereinbefore, one means of reducing that error is a high gain amplifier in place of the transistor $Q_4$ so that a small change in the currents $I_1$ and $I_2$ is represented by a large change in current at the output terminal 11, but that would involve not only a more costly circuit design but also greater dissipation of power. An improved means of reducing that error in a less expensive manner in terms of both circuit design and power dissipation is to connect the emitter of the transistor $Q_4$ to the constant current source, either as shown or by connecting the emitters of the transistors $Q_3$ and $Q_4$ through an impedance. A fifth transistor $Q_5$ is employed in the illustrated embodiment to provide that connection, but that is not essential. It is preferred, however, because the voltage difference between the emitters of $Q_4$ and $Q_3$ is relatively large and would result in greater power dissipation if only a resistor is used to connect the emitter of the transistor $Q_4$ to the constant current source.

In operation, the present invention eliminates the error in the output signal $E_2$ by maintaining the ratio of currents $I_1$ and $I_2$ equal for a change in the input signal $E_1$. As the current $I_1$ changes due to a change in the input signal $E_1$, a corresponding change is caused in the current $I_2$ by the change in current drawn through transistor $Q_5$. For example, assuming a change in the current $I_1$ equal to +1 ma., a change in the current $I_2$ equal to +1 ma. is caused by a change of current $I_3$ through the transistor $Q_5$ equal to −2 ma. The ratio 1:2 for the ratio of currents $I_1$:$I_3$ is selected because the change in $I_2$ is approximately equal to the change in $I_1$. That ratio is established directly by the inverse ratio $R_1$:$R_2$ of resistors 11 and 12. Particularly values for $R_1$ and $R_2$ are 2K and 1K, respectively.

For better results, a diode 13 is connected in series with the resistor 11 in order that the impedance of the base-emitter junction of the transistor $Q_4$ in series with the resistor 12 be approximately compensated. The impedance of the base-emitter impedance of the transistor $Q_5$ may be made negligible as compared to that of the resistor 12 and may be ignored. However, for even better results, compensating impedance may be connected in series with the resistor 11. Capacitors 14 and 15, together with resistors 16 and 17 are provided for stability against oscillations in the feedback loop. Bias resistors 18 and 19 establish the quiescent operating condition. Resistor 21 may be used to adjust the D-C offset between terminals 10 and 20 to zero.

Any change from the quiescent condition is immediately balanced by a change in the current $I_3$ through the transistor $Q_5$. In other words, any change in the current $I_1$ through the transistor $Q_1$ which would cause an opposite change in the current $I_2$ through the transistor $Q_2$ due to the use of a constant current source (the transistor $Q_3$ and associated bias circuit) causes an opposite change in the current $I_3$ of twice the magnitude of the change in the current $I_1$ thereby causing an equal change of the same polarity in the current $I_2$. With the ratio of the currents $I_1$ and $I_2$ constantly equal, the base-emitter voltages of transistor $Q_1$ and $Q_2$ remain substantially equal at all times. In that manner the output voltage $E_2$ is maintained equal to the input voltage $E_1$ in accordance with Equation 2. It can be demonstrated that this improved result is achieved for either A-C or D-C operation.

For an analysis of A-C operation, let the ratio of the current $i_3$ of the transistor $Q_5$ to the current $i_1$ of the transistor $Q_1$ be equal to the ratio of the resistance $R_1$ of the resistor 11 to the resistance $R_2$ of the resistor 12. Then the current $i_3$ is equal to $$i_1\frac{R_1}{R_2}$$

Setting the ratio $R_1/R_2$ equal to a constant $k$, the following equations may be written for the output voltage $e2$ and the current $i_2$.

$$E_2=E_1-i_1r_{e1}+i_2r_{e2} \quad (4)$$

$$i_2=i_3-i_1 \quad (5)$$

Substituting for $i_3$ in Equation 5 its value in terms of $i_1$ yields the following equation.

$$i_2=i_1(k-1) \quad (6)$$

To hold the output voltage $E_2$ equal to the input $E_1$, the sum of $-i_1r_{e1}+i_2r_{e2}$ in Equation 4 must equal zero. Thus from Equations 4 and 6 the following relationships for A-C balance are determined.

$$\frac{i_2}{i_1}=k-1 \quad (7)$$

$$\frac{i_2}{i_1}=\frac{r_{e1}}{r_{e2}} \quad (8)$$

$$\frac{r_{e1}}{r_{e2}}=k-1 \quad (9)$$

$$k=\frac{r_{e1}}{r_{e2}}+1 \quad (10)$$

Since $k$ is equal to the ratio $R_1/R_2$, the equality of Equation 10 may be readily established for A-C balance by adjusting the value of $R_1$ or $R_2$.

The following analysis of D-C operation to show that correction of zero offset may be readily made is based on Equation 1. From that equation it may be seen that $E_2$ is equal to $E_1$ when:

$$I_2=\frac{V_{bet}V_{be2}+I_1r_{e1}}{r_{e2}} \quad (11)$$

The current $I_3$ of the transistor $Q_5$ is given by the following equation:

$$I_3=\frac{(V_4-V_3)-I_1R_1}{R_2} \quad (12)$$

With a constant current $I_4$ through the transistor $Q_3$, $I_2$ is given by the following equation:

$$I_2=I_4-I_1-I_3 \quad (13)$$

Substituting for $I_3$ in Equation 13 from Equation 12:

$$I_2=I_4-I_1-\frac{(V_4-V_3)-I_1R_1}{R_2} \quad (14)$$

Substituting $k$ for the ratio $R_1/R_2$ in Equation 14 provides the following equation:

$$I_2=I_4+(k-1)I_1-\frac{(V_4-V_3)}{R_2} \quad (15)$$

Setting Equation 15 equal to Equation 11:

$$I_4+(k-1)I_1-\frac{(V_4-V_3)}{R_2}=\frac{V_{bet}V_{be2}}{r_{e2}}+\frac{I_1r_{e1}}{r_{e2}} \quad (16)$$

$$I_1\left(k-1-\frac{r_{e1}}{r_{e2}}\right)=\frac{V_{be1}-V_{be2}}{r_{e2}}+\frac{(V_4-V_3)}{R_2}-I_4 \quad (17)$$

From Equation 10 it may be seen that the quantity $$k-1-\frac{r_{e1}}{r_{e2}}$$

is equal to zero for an A-C balanced amplifier. Consequently, Equation 17 may be written as follows:

$$I_4=\frac{V_{be1}-V_{be2}}{r_{e2}}+\frac{(V_4-V_3)}{R_2} \quad (18)$$

Accordingy, to establish the relationship defined by Equation 18 for the condition of $E_2$ equal to $E_1$, either $I_4$ may be adjusted or the values $V_4$, $V_3$ and $R_2$ may be adjusted, either individually or in combination. In other words, to adjust the D-C offset of the amplifier to zero $V_4$, $V_3$, $R_2$ or $I_4$ may be varied. For this analysis, the constant current $I_4$ is varied to adjust the D-C offset to zero.

Upon adjusting for zero offset, it is desirable to have most of the change in the current $I_4$ enter the transistor $Q_2$. Otherwise it would be difficult to adjust the value of $I_2$ to satisfy Equation 11. However, it can be demonstrated that due to the gain of the transistor $Q_4$ in the feedback circuit, most of the change in the current $I_4$ will go through the transistor $Q_2$.

To assure optimum benefit from the improved means for maintaining the currents of paragoned active elements in the illustrated amplifier constantly equal, the constant current source is first adjusted until the voltages at the input and output terminals are equal. Then the input voltage $E_1$ is varied. If the output voltage $E_2$ is not equal to the input voltage $E_1$, the ratio of the resistors 11 and 12 may be modified and the constant current source again adjusted. This process may be repeated until the output voltage is equal to the input voltage throughout a desired range of voltages.

It should be understood that although the principles of this invention have been illustrated by a particular circuit using transistors, the same principles will apply to other circuits using paragoned transistors. It should be further understood that the same principles are equally applicable to circuits employing other types of active elements, such as field effect transistors or the more recently developed MOS (metal-oxide-semiconductor) field effect transistors. The applied claims are therefore intended to cover and embrace other circuits and elements, within the limits only of the true spirit and scope of the invention.

What is claimed is:

1. In a circuit using active elements connected to a common source of constant current, a system for maintaining constant the ratio of currents through said elements comprising first means for detecting a current in one of said active elements, and second means coupled to a junction of the active elements and the constant current source for conducting a proportionately greater current of opposite polarity in response to detected current in said one of said active elements, the proportion being so adjusted as to force a current through at least one other element equal to the current through said one of said active elements.

2. In a circuit using active elements connected to a common source of constant current, a system for maintaining constant the ratio of currents through said elements comprising first means for detecting a current in one of said active elements comprising a first impedence element serially connected thereto and an output terminal connected at the junction therebetween, and second means comprising an active element coupled to a junction between the active elements and the constant current source by a second impedance element, the impedance of said second impedance element being approximately half the impedance of said first impedance element.

3. In combination a differential amplifier comprising a first active element having its control electrode connected to an input terminal, a second active element, each of said first and second active elements having a like electrode connected to a common source of constant current, and a feedback circuit from the output electrode of said first active element to the control electrode of said second active element, said feedback current including an active element connected to conduct current from said constant current source in response to the voltage signal being fed back through the control electrode of said second active element.

4. In a circuit for maintaining a voltage at an output terminal equal to a voltage at an input terminal, first and second semiconductor devices, the first having a control electrode connected to said input terminal, the second having a control electrode connected to said output terminal, and each having a pair of terminals, one being connected to a common current source and the other being connected to a load impedance, whereby current is conducted through said devices in response to voltages at respective control electrodes, and a third semiconductor device having its control electrode connected to the junction of said first semiconductor device and its associated load impedance, and a pair of terminals, one being connected to said common current source through an impedance element and the other being connected to said output terminal, the impedance of said impedance element being smaller than the load impedance associated with said first device by a factor of approximately two.

5. In a circuit for maintaining a voltage at an output terminal equal to a voltage at an input terminal, first and second transistors, the first having its base connected to said input terminal, the second having it base connected to said output terminal, and each having its emitter connected to a common source of constant current, first and second impedance means coupling the respective collectors of said first and second transistors to respective first and second sources of bias potential, and a third transistor having its base connected to the collector of said first transistor and its emitter-collector-circuit in series between said constant current source and the base of said second transistor.

6. In a circuit for maintaining a voltage at an output terminal equal to a voltage at an input terminal first and second transistors, the first having its base connected to said input terminal, the second having its base connected to said output terminal, and each having its emitter connected to a common source of constant current, first and second impedance means coupling the respective collectors of said first and second transistors to respective first and second sources of bias potential, and a third transistor having its base connected to the collector of said first transistor, its emitter impedance coupled to said constant current source and its collector connected to the base of said second transistor.

7 In combination a differential amplifier comprising first and second transistors of like conductivity type each having its emitter connected to a constant current source, the first transistor having its collector connected to a source of bias potential by a first resistor and its base electrode connected to an input terminal, the second transistor having its base electrode connected to an output terminal, a third transistor of a conductivity type opposite said first and second transistors, said third transistor having its base electrode connected to the collector electrode of said first transistor and its collector electrode connected to the base electrode of said second transistor, and a resistor coupling the emitter of said third transistor to said constant current source.

8. The combination as defined in claim 7 including a diode in series with said resistor coupling the collector of said first transistor to a source of bais potential.

9. In combination a differential amplifier comprising first and second transistors of like conductivity type each having its emitter connected to a constant current source, the first transistor having its collector connected to a source of bias potential by a first resistor and its base electrode connected to an input terminal, the second transistor having its base electrode connected to an output terminal, a third transistor of a conductivity type opposite said first and second transistors, said third transistor having its base electrode connected to the collector electrode of said first transistor and its collector electrode connected to the base electrode of said second transistor, and an impedance means connecting the emitter of said third transistor to said constant current source, said impedance means including a fourth transistor in series with a second resistor.

10. The combination as defined in claim 9 including a diode in series with said resistor coupling the collector of said first transistor to a source of bias potential.

References Cited

UNITED STATES PATENTS

| | | | |
|---|---|---|---|
| 2,849,606 | 8/1958 | Parker et al. | 328—146 |
| 2,949,546 | 8/1960 | McVey | 307—88.5 |
| 3,310,688 | 3/1967 | Ditkofsky | 307—88.5 |

JOHN F. COUCH, *Primary Examiner.*

W. E. RAY, *Assistant Examiner.*